(12) United States Patent
Jeong

(10) Patent No.: US 6,720,224 B2
(45) Date of Patent: Apr. 13, 2004

(54) METHOD FOR FORMING TRANSISTOR OF SEMICONDUCTOR DEVICE

(75) Inventor: Ku Cheol Jeong, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/331,352

(22) Filed: Dec. 31, 2002

(65) Prior Publication Data

US 2003/0216005 A1 Nov. 20, 2003

(30) Foreign Application Priority Data

May 20, 2002 (KR) .................. 10-2002-0027913

(51) Int. Cl.$^7$ ............................................. H01L 21/336
(52) U.S. Cl. .................... 438/301; 438/303; 438/302; 438/289
(58) Field of Search ................. 438/301, 302, 438/303, 289, 199, 579, 166, 282, 232, 183

(56) References Cited

U.S. PATENT DOCUMENTS

| | | | | |
|---|---|---|---|---|
| 5,492,847 A | * | 2/1996 | Kao et al. ................. | 438/302 |
| 5,736,440 A | * | 4/1998 | Manning ................... | 438/232 |
| 6,025,238 A | * | 2/2000 | Gardner .................... | 438/301 |
| 6,221,724 B1 | * | 4/2001 | Yu et al. .................... | 438/289 |
| 6,300,205 B1 | * | 10/2001 | Fulford et al. ............. | 438/303 |
| 6,440,805 B1 | * | 8/2002 | Wang et al. ............... | 438/282 |
| 6,451,639 B1 | * | 9/2002 | Jang et al. ................. | 438/183 |
| 6,489,191 B2 | * | 12/2002 | Shao et al. ................. | 438/199 |
| 6,521,949 B2 | * | 2/2003 | Assaderaghi et al. ...... | 257/347 |
| 6,531,380 B2 | * | 3/2003 | Li et al. ..................... | 438/579 |
| 6,541,317 B2 | * | 4/2003 | Muller et al. .............. | 438/166 |
| 6,548,842 B1 | * | 4/2003 | Bulucea et al. ............ | 257/288 |
| 6,599,804 B2 | * | 7/2003 | Bulucea et al. ............ | 438/301 |

* cited by examiner

*Primary Examiner*—John F. Niebling
*Assistant Examiner*—Walter L. Lindsay, Jr.
(74) *Attorney, Agent, or Firm*—Jacobson Holman PLLC

(57) ABSTRACT

The present invention relates to a methods for forming transistor of semiconductor device, and more particularly to a improved method for forming transistor of semiconductor device wherein a thermal oxide film formed on an edge portion of gate electrode by a thermal oxidation process on a gate electrode to reduce parasitic capacitance generated from overlapping between a drain region and a gate electrode region.

10 Claims, 4 Drawing Sheets

METHOD FOR FORMING TRANSISTOR OF SEMICONDUCTOR DEVICE

BACKGROUND

1. Technical Field

The present invention relates to a method for forming transistor of semiconductor device, and more particularly to a improved method for forming transistor of semiconductor device wherein a thermal oxide film is formed of an edge portion of a gate electrode by a thermal oxidation process on a gate electrode to reduce parasitic capacitance generated from overlapping between a drain region and a gate electrode region.

2. Description of the Related Art

The size of transistor has been reduced as the integration density and the operation speed of semiconductor devices is increased. As a result, the size of source/drain region is reduced and internal electrical resistance of the device is increased.

As the dimension of the transistor becomes smaller, the degree of overlapping between a gate electrode and a source/drain region increases, resulting in generation of a parasitic capacitance at the overlapping portion of an edge portion of the gate electrode and the source/drain region. This overlapping increase gate induced drain leakage (GIDL) which increases power consumption and reduces the operation speed of the device to degrade the characteristics of the device.

FIGS. 1a through 1c are cross-sectional diagrams illustrating sequential steps of a conventional method for manufacturing a transistor.

Referring to FIG. 1a, a device isolation film (not shown) defining an active region is formed on a semiconductor substrate 1, and an oxide film (not shown) and a conductive layer for gate electrode (not shown) are then sequentially formed in the active region.

Thereafter, the oxide film (not shown) and the conductive layer for gate electrode (not shown) are patterned by a selective etching process using a mask for gate electrode (not shown) to form a dummy gate 7 including a stacked structure of a gate oxide film 3 and a gate electrode 5.

Then, a low concentration P+impurity junction region 9 is formed on the active region of the semiconductor substrate 1 using the dummy gate 7 as an etching mask.

Referring to FIG. 1b, a halo-doped region 11 is formed on the substrate 1 below the impurity junction region 9.

Referring to FIG. 1c, an insulating film (not shown) is formed on entire surface of the resultant structure, and then etched to form an insulating film spacer 13.

FIG. 2 is a graph illustrating junction leakage current according to a bias voltage applied to a drain region of a conventional transistor. When the bias voltage $Bias_{drain}[V]$ increases and a difference of gate voltage Vg varies from 2 to −2 volt, the leakage current $L_{leak}[K]$ increases.

In order to solve foregoing problem, a process of re-oxidizing the insulating film spacer 13 is introduced in the conventional method, but the process has been found to be ineffective.

SUMMARY OF THE INVENTION

Improved methods for forming a transistor of a semiconductor substrate are disclosed wherein parasitic capacitance is reduced by thermally oxidizing an edge portion of gate oxide film to increase the thickness of the gate oxide film between the gate electrode and an impurity junction region under the edge portion of the gate electrode.

One disclosed method comprises;
 forming a dummy gate having a stacked structure of a gate oxide film and a gate electrode on a semiconductor substrate;
 forming a first insulating film on the entire surface of the resultant structure;
 over-etching the first insulating film to form first insulating film spacers on the lower portion of both sidewalls of the dummy gate;
 forming a second insulating film on entire surface of the resultant structure;
 etching the second insulating film to form second insulating film spacers on the upper portion of the both sidewalls of the dummy gate;
 removing the first insulating film spacers to form openings each of which exposes the sidewall of the gate oxide film;
 performing a thermal oxidation process to form a thermal oxide film filling up the opening;
 ion-implanting low concentration impurities onto the substrate using the dummy gate and the second insulating film spacer as a mask to form a low concentration impurity junction regions on both sides of the dummy gate; and
 performing a halo implant process using the dummy gate and the second insulating film spacer as a mask to form a halo doped region which is disposed under the both low concentration impurity junction regions and extends into the channel region under the dummy gate.

Here, it is preferable that an oxide film is formed on entire surface including the dummy gate electrode at a thickness ranging from 100 to 300 Å, then over-etched to form the first insulating film spacer at lower sidewalls of the dummy gate electrode. The first insulating film spacer has a height of less than 300 Å, preferably ranging from 50 to 100 Å.

It is preferable that a material selected from the group consisting of nitride and alumina is formed on the entire surface of the resultant structure, and then etched to form the second insulating film spacer at upper sidewalls of the dummy gate electrode, the entire portion of the first insulating film spacer at a thickness ranging from 100 to 300 Å.

The opening exposing a gate oxide film is preferably formed by removing the first insulating film spacer using a difference in etching selectivity between the semiconductor substrate and the second insulating film spacer.

The thermal oxidation process of the exposed gate oxide film is preferably performed at a temperature ranging from 850 to 1000° C. The thermal oxide film preferably has a thickness ranging from 200 to 500 Å.

It is preferable that the ion-implanting process of low concentration impurity and the halo implant process are tilt ion-implanting processes having a tilt angle ranging from 7° to 15° and from 30° to 70°, respectively, with respect to the vertical direction to the surface of the semiconductor substrate.

The halo implant process, so called a pocket implant process, is introduced to inhibit a short channel effect generated from decrease of channel length of MOSFET, wherein the substrates is preferably implanted with a p-type and a n-type impurities in case of NMOS and PMOS, respectively, to partially increase a doping concentration of channel.

The halo implant process may also decrease depletion layers a bias is applied to effectively inhibiting short channel effects such as DIBL (drain induced barrier lowering).

According to the above-described method for forming a transistor, the parasitic capacitance at the edge portion of dummy gate electrode which occurs from overlapping of drain region and gate electrode region is reduced by thermally oxidizing the edge portion of the gate insulating film exposed through an opening to thicken the gate insulating film. As a result, the degradation of device characteristics due to GIDL may be prevented.

DETAILED DESCRIPTION OF THE PREFERRED EMBODIMENTS

Figure 1A:
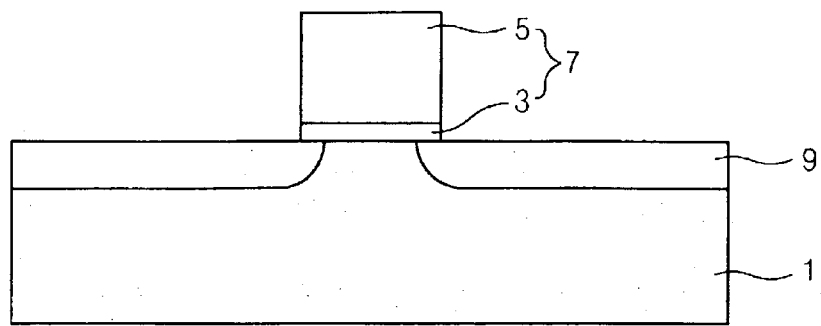
FIGS. 1a through 1c are diagrams illustrating a conventional method for forming a transistor in accordance with the conventional art.
Figure 1B:
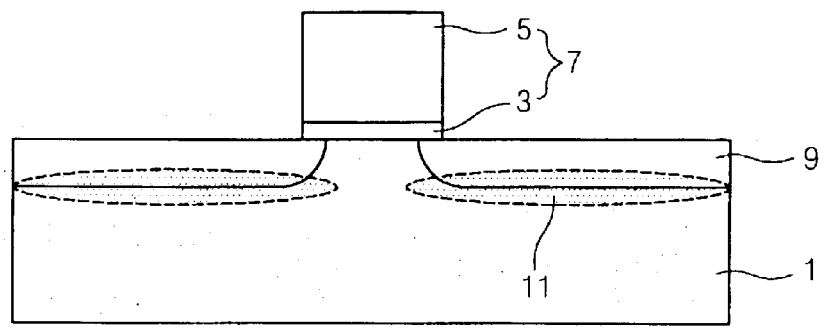
Figure 1C:
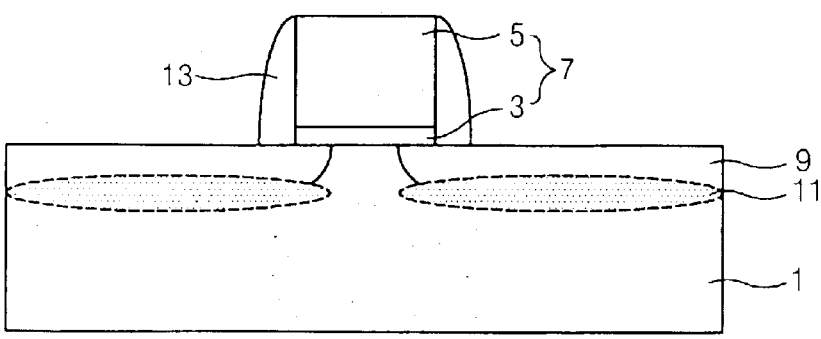
Figure 2:
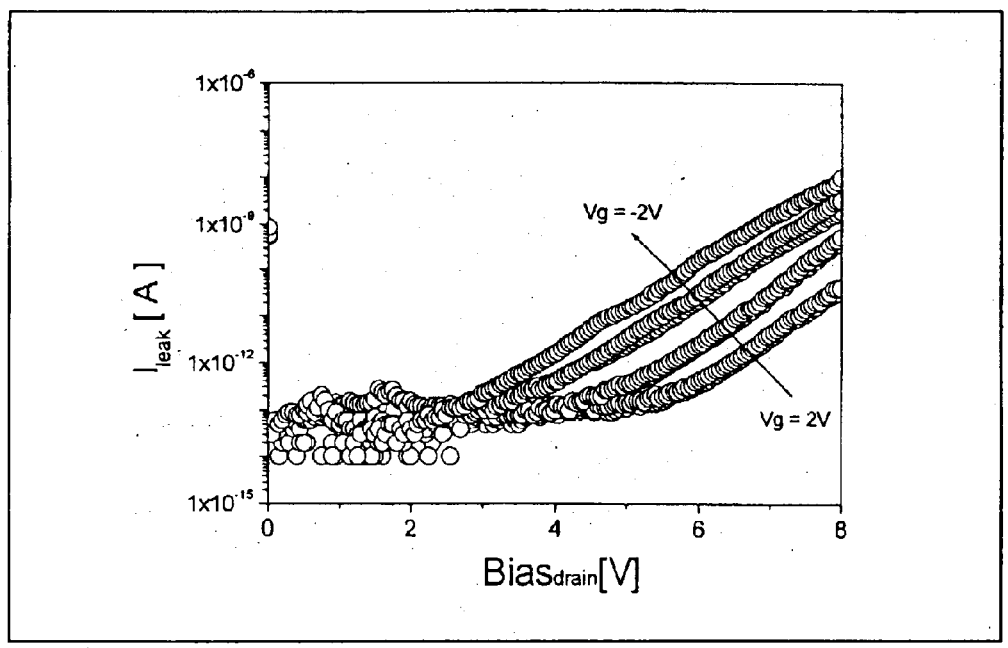
FIG. 2 is a graph illustrating characteristics of junction leakage current according to bias voltage.

A method for forming a transistor will be described in detail while referring to the drawings.

FIGS. 3a through 3e are cross-sectional diagrams illustrating a method for forming a transistor of a semiconductor device in accordance with an embodiment of the present invention.

Figure 3A:
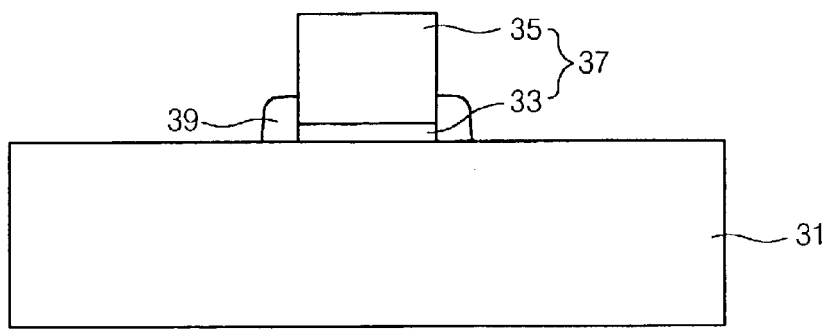
FIGS. 3a through 3e are cross-sectional diagrams illustrating a method for forming a transistor in accordance with the present invention.

Referring to FIG. 3a, an oxide film (not shown) and a conductive layer for gate electrode (not shown) are sequentially formed on the semiconductor substrate 11 having a device isolation film (not shown).

The oxide film (not shown) and the conductive layer for gate electrode (not shown) are patterned by a photo-etching process using masks for gate electrode to form a dummy gate 37 comprising a stacked structure of a gate oxide film 33 and a gate electrode 35.

Thereafter, a first insulating film (not shown) composed of oxide film is formed on entire surface of the resultant structure. The first insulating film (not shown) preferably has a thickness ranging from 100 to 300 Å.

The first insulating film (not shown) is then etched back to form a first insulating film spacer 39 on a bottom portion of the sidewall of the dummy gate 37. Here, the first insulating film (not shown) is over-etched so that the first insulating film spacer 39 is formed at the lower portion of the sidewall of the dummy gate 37 and has a thickness ranging from 0 to 100 Å.

Figure 3B:
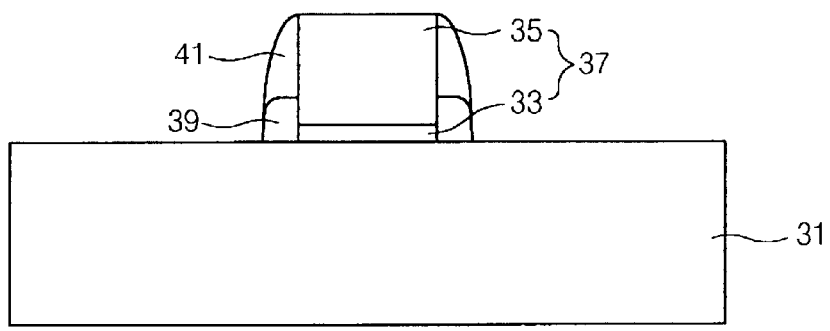

Referring to FIG. 3b, a second insulating film (not shown) composed of a nitride film is formed on entire surface of the resultant structure, and then anisotropically etched to form a second insulating film spacer 41 on the first insulating film spacer 39 on the upper portions of the sidewall of the dummy gate 37. The second insulating film spacer 39 has a thickness ranging from 100 to 300 Å.

Figure 3C:
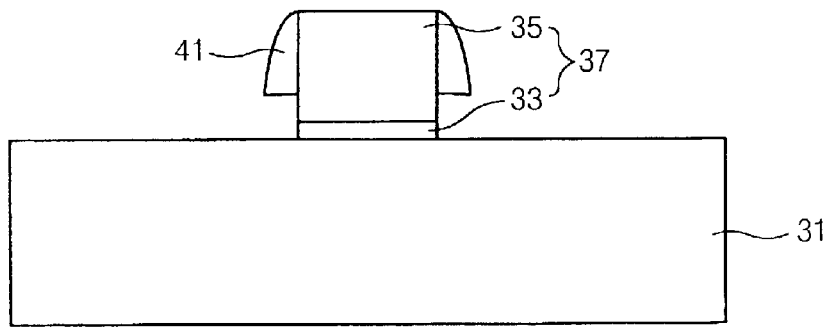

Referring to FIG. 3c, the first insulating film spacer 39 is removed by an etching process such as a wet etching process utilizing a etching selectivity ratio between the silicon substrate 31 and the second insulating film spacer 41 to form an opening which exposes the gate oxide film 33 and a lower portion of the gate electrode 35 of the dummy gate 37.

Figure 3D:
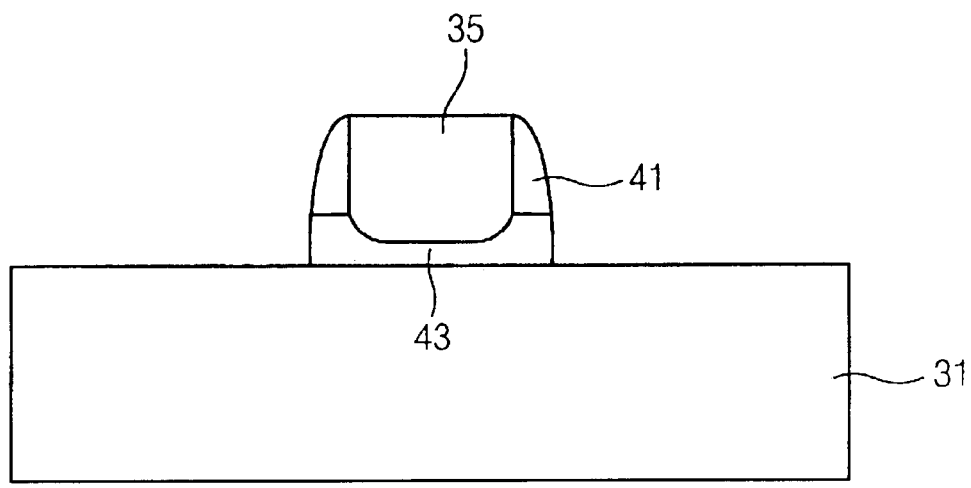

Referring to FIG. 3d, a thermal oxidation process is performed on entire surface of the resultant structure to form a thermal oxide film 43. The portion of the gate oxide film 33 exposed through the opening is grown by the thermal oxidation process to fill the opening. Preferably, the thermal oxide film 43 has a thickness ranging from 200 to 500 Å.

Figure 3E:
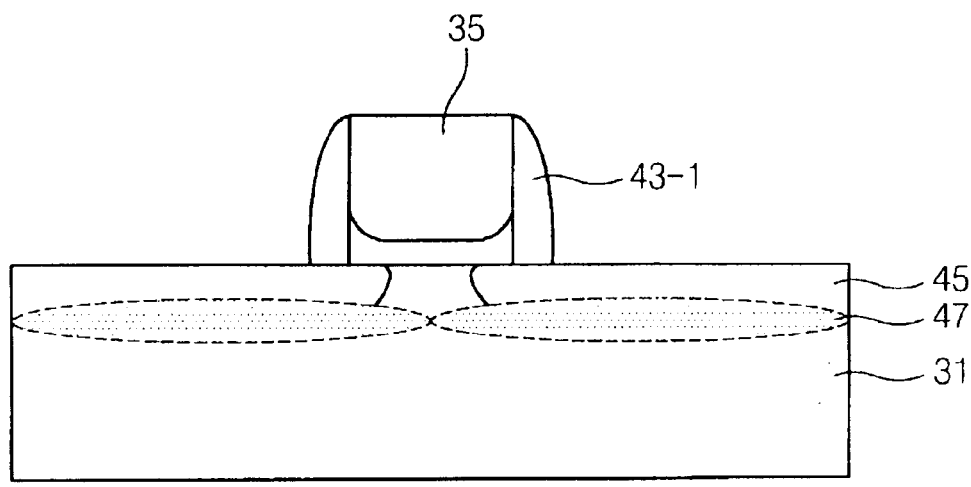

Referring to FIG. 3e, an ion-implant process, preferably tilt ion-implant process, is performed to form a low concentration impurity junction region using the dummy gate 37, the second insulating film spacer 41 and the thermal oxide film 43 as masks. Here, the tilt angle of the tilt ion-implant process preferably ranges from 7° to 15° with respect to the vertical direction to the substrate 11.

Thereafter, a halo implant process, preferably a tilt ion-implant process, is performed to form a halo implant doped region 47 using the dummy gate 37, the second insulating film spacer 41 and the thermal oxide film 43 as masks. Here, the tilt angle of the tilt ion-implant process preferably ranges from 30° to 70° with respect to the vertical direction to the substrate 11.

As discussed earlier, in accordance with the present invention, the overlapping between impurity junction region and gate electrode is prevented by forming the thermal oxide having a thicker edge portion than the center portion suing a thermal oxidation process. As a result, parasitic capacitance in the edge portion of the gate oxide is inhibited, thereby preventing degradation of characteristics of device caused by GIDL.

What is claimed is:

1. A method for forming a transistor comprises:
   forming a dummy gate having a stacked structure of a gate oxide film and a gate electrode on a semiconductor substrate;
   forming a first insulating film on the entire surface of the resultant structure;
   over-etching the first insulating film to form first insulating film spacers on the lower portion of both sidewalls of the dummy gate;
   forming a second insulating film on entire surface of the resultant structure;
   etching the second insulating film to form second insulating film spacers on the upper portion of the both sidewalls of the dummy gate;
   removing the first insulating film spacers to form openings each of which exposes the sidewall of the gate oxide film;
   performing a thermal oxidation process to form a thermal oxide film filling up the opening;
   ion-implanting low concentration impurities onto the substrate using the dummy gate and the second insulating film spacer as a mask to form low concentration impurity junction regions on both sides of the dummy gate; and
   performing a halo implant process using the dummy gate and the second insulating film spacer as a mask to form a halo doped region which is disposed under the both low concentration impurity junction regions and extends into the channel region under the dummy gate.

2. The method according to claim 1, wherein the first insulating film consists of an oxide film.

3. The method according to claim 1, wherein the first insulating film is as thick as 100 to 300 Å.

4. The method according to claim 1, wherein the first insulating film spacer is formed as high as 50 to 100 Å.

5. The method according to claim 1, wherein the second insulating film is formed with a material selected from the group consisting of a nitride and an alumina.

6. The method according to claim 1, wherein the second insulating film spacer is formed as thick as 100 to 300 Å.

7. The method according to claim 1, wherein the thermal oxidation process is performed at a temperature ranging from 850 to 1000° C.

8. The method according to claim 1, wherein the thermal oxide film is formed as thick as 200 to 500 Å.

9. The method according to claim 1, wherein the step of ion-implanting low concentration impurities is performed by a tilt ion-implanting process having a tilt angle ranging from 7° to 15° with respect to the vertical direction to the semiconductor substrate.

10. The method according to claim 1, wherein the step of performing a halo implant process is performed by a tilt ion-implant having a tilt angle ranging from 30° to 70° with respect to the vertical direction to the semiconductor substrate.

* * * * *